US008479159B2

(12) United States Patent
Klinger et al.

(10) Patent No.: US 8,479,159 B2
(45) Date of Patent: Jul. 2, 2013

(54) SYSTEM AND METHOD FOR AUTOMATICALLY DETERMINING RELATIONSHIPS BETWEEN SOFTWARE ARTIFACTS USING MULTIPLE EVIDENCE SOURCES

(75) Inventors: Tamir Klinger, Brooklyn, NY (US); Peri L. Tarr, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 1782 days.

(21) Appl. No.: 11/763,496

(22) Filed: Jun. 15, 2007

(65) Prior Publication Data

US 2008/0098360 A1 Apr. 24, 2008

Related U.S. Application Data

(60) Provisional application No. 60/853,292, filed on Oct. 20, 2006.

(51) Int. Cl.
*G06F 9/44* (2006.01)
(52) U.S. Cl.
USPC ............................ 717/120; 717/101; 717/104
(58) Field of Classification Search
None
See application file for complete search history.

(56) References Cited

U.S. PATENT DOCUMENTS

| | | | | |
|---|---|---|---|---|
| 7,490,317 B1 * | 2/2009 | Hahn et al. | | 717/121 |
| 7,546,582 B2 * | 6/2009 | Smith | | 717/120 |
| 7,617,224 B2 * | 11/2009 | Moulckers et al. | | 717/120 |
| 7,627,855 B2 * | 12/2009 | Inoue et al. | | 717/120 |
| 7,716,649 B2 * | 5/2010 | Clemm et al. | | 717/128 |
| 7,735,068 B2 * | 6/2010 | Siddaramappa et al. | | 717/101 |
| 7,930,196 B2 * | 4/2011 | Fung et al. | | 705/7.37 |
| 8,010,947 B2 * | 8/2011 | Carbone et al. | | 717/120 |
| 8,099,429 B2 * | 1/2012 | Deyo et al. | | 707/776 |
| 8,266,590 B2 * | 9/2012 | Smith | | 717/120 |
| 2004/0015858 A1 * | 1/2004 | Seto et al. | | 717/104 |
| 2004/0103181 A1 * | 5/2004 | Chambliss et al. | | 709/223 |
| 2004/0255272 A1 * | 12/2004 | Ondrusek et al. | | 717/120 |
| 2005/0120333 A1 * | 6/2005 | Inoue et al. | | 717/101 |
| 2005/0273758 A1 * | 12/2005 | Long | | 717/101 |
| 2005/0278700 A1 * | 12/2005 | Buskens et al. | | 717/120 |
| 2006/0010425 A1 * | 1/2006 | Willadsen et al. | | 717/120 |
| 2006/0031203 A1 * | 2/2006 | Rosenbaum et al. | | 707/3 |

(Continued)

OTHER PUBLICATIONS

Čubranić et al., "Hipikat: A Project Memory for Software Development", Jun. 2005, IEEE, IEEE Transactions on Software Engineering, vol. 31, No. 6, pp. 446-465 <http://ieeexplore.ieee.org/stamp/stamp.jsp?tp=&arnumber=1463229>.*

(Continued)

*Primary Examiner* — Thuy Dao
*Assistant Examiner* — Ben C Wang
(74) *Attorney, Agent, or Firm* — Anne V. Dougherty; Ryan, Mason & Lewis, LLP

(57) ABSTRACT

A method (which can be computer implemented) for inferring whether at least a first relationship exists between at least first and second entities includes the steps of applying a first assessor to obtain a first confidence level pertaining to putative existence of said at least first relationship between said at least first and second entities, applying a second assessor to obtain a second confidence level pertaining to putative existence of said at least first relationship between said at least first and second entities, and combining said first and second confidence levels to obtain an overall inference whether said at least first relationship exists between said at least first and second entities.

31 Claims, 8 Drawing Sheets

U.S. PATENT DOCUMENTS

| | | | |
|---|---|---|---|
| 2006/0136894 A1* | 6/2006 | Stallo et al. | 717/120 |
| 2006/0168557 A1* | 7/2006 | Agrawal et al. | 717/104 |
| 2006/0282546 A1* | 12/2006 | Reynolds et al. | 709/248 |
| 2007/0083492 A1* | 4/2007 | Hohimer et al. | 707/3 |
| 2007/0130561 A1* | 6/2007 | Siddaramappa et al. | 717/106 |
| 2008/0235664 A1* | 9/2008 | Carbone et al. | 717/120 |
| 2008/0256515 A1* | 10/2008 | Ponce de Leon | 717/120 |
| 2008/0319731 A1* | 12/2008 | Chambliss et al. | 703/22 |
| 2010/0049564 A1* | 2/2010 | Lewis et al. | 705/7 |
| 2010/0095268 A1* | 4/2010 | Lowry et al. | 717/120 |
| 2010/0107140 A1* | 4/2010 | Bull et al. | 717/120 |
| 2010/0115492 A1* | 5/2010 | Yoshimura et al. | 717/120 |
| 2010/0169864 A1* | 7/2010 | Hwang | 717/120 |
| 2010/0175044 A1* | 7/2010 | Doddavula et al. | 717/120 |
| 2010/0211924 A1* | 8/2010 | Begel et al. | 717/101 |
| 2010/0281455 A1* | 11/2010 | Anand et al. | 717/104 |
| 2011/0099536 A1* | 4/2011 | Coldicott et al. | 717/120 |
| 2011/0185340 A1* | 7/2011 | Trent et al. | 717/104 |

OTHER PUBLICATIONS

Davor Čubranić, "Project History as a Group Memory: Learning From the Past", Dec. 2004, The University of British Columbia, pp. 1-149 <http://www.cs.ubc.ca/labs/spl/theses/2004/Davor_Cubranic.pdf>.*

Madhavan et al., "Generic Schema Matching with Cupid", Aug. 2001, Microsoft Research, MSR-TR-2001-58, pp. 1-15; <http://db.cs.washington.edu/papers/CupidTechReport.pdf>.*

Kagdi et al., "Software Repositories—A Source for Traceability Links", 2007 ACM, TEFSE/GCT'07, Mar. 22-23, 2007, Lexington, KY, USA, pp. 1-9; <http://www.cs.kent.edu/~jmaletic/papers/TEFSE07-kagdi.pdf>.*

De Lucia et al., "Recovering Traceability Links in Software Artifact Management Systems using Information Retrieval Methods", 2007 ACM, vol. 16, No. 4, Article 13, Sep. 2007, pp. 10-50; <http://dl.acm.org/results.cfm?h=1&source_query=&&cfid=181934789&cftoken=31538038>.*

Richardson et al., "Automating Traceability for Generated Software Artifacts", 2004 IEEE, ASE'04, pp. 1-10; <http://ieeexplore.ieee.org/stamp/stamp.jsp?tp=&arnumber=1342721>.*

Saleem et al., "Towards Identification and Recognition of Trace Associations in Software Requirements Traceability", IJCSI International Journal of Computer Science Issues, vol. 9, Issue 5, No. 2, Sep. 2012; <http://ijcsi.org/papers/IJCSI-9-5-2-257-263.pdf>.*

Corley et al., "Recovering Traceability Links between Source Code and Fixed Bugs via Patch Analysis", 2011 ACM, TEFSE'11, May 23, 2011, Waikiki, HI, USA, pp. 31-37; <http://dl.acm.org/citation.cfm?id=1987856.1987863>.*

Kagdi et al., "Mining Software Repositories for Traceability Links", 2007 IEEE, ICPC'07, pp. 1-10; <http://ieeexplore.ieee.org/stamp/stamp.jsp?tp=&arnumber=4268249>.*

Antoniol et al., "Recovering Traceability Links between Code and Documentation"; IEEE Transactions on Software Engineering, vol. 28., No. 10, Oct. 2002.

Chesley et al., "Chianti: A Tool for Change Impact Analysis of Java Programs", OOPSLA'04, Oct. 24-28, 2004, Vancouver, British Columbia, Canada.

Faisal et al., "Toward Automating the Discovery of Traceability Links"; University of Colorado, Department of Computer Science, 2005, Graduate School thesis.

Mandelin et al., "A Bayesian Approach to Diagram Matching with Application to Architectural Models", ICSE'06, May 20-28, 2006, Shanghai, China.

Murphy et al., "Software Reflexion Models: Bridging the Gap between Source and High-Level Models", SIGSOFT'95 Washington, D.C., USA.

Shepherd et al. "Using Language Clues to Discover Crosscutting Concerns", Workshop on Modeling and Analysis of Concerns in Software (MACS 2005), May 16, 2005, St Louis MO.

Baniassad et al., "Design Pattern Rational Graphs: Linking Design to Source", IEEE, 2003.

Cubranic et al., "Hipikat: Recommending Pertinent Software Development Artifacts", Department of Computer Science, University of British Columbia, IEEE 2003.

Gotel et al., "An Analysis of the Requirements Traceability Problem," Requirements Engineering, Proceedings of the First International Conference, Department of Computing, Imperial College of Science, Technology & Medicine, IEEE, 1994, pp. 94-101.

Gotel et al., "Extending Requirements Traceability Through Contribution Structures," Proceedings of 3rd International Symposium on Requirements Engineering (RE'97), IEEE, 1997, pp. 169-178.

Marcus et al., "Recovering Documentation-to-Source-Code Traceability Links Using Latent Semantic Indexing," Department of Computer Science, Kent State University, IEEE, 2003.

Ramesh et al., "Implementing Requirements Traceability: A Case Study," IEEE, 1995.

* cited by examiner

SYSTEM AND METHOD FOR AUTOMATICALLY DETERMINING RELATIONSHIPS BETWEEN SOFTWARE ARTIFACTS USING MULTIPLE EVIDENCE SOURCES

CROSS-REFERENCE TO RELATED APPLICATIONS

This patent application claims the benefit of U.S. Provisional Patent Application Ser. No. 60/853,292 filed on Oct. 20, 2006, and entitled "System and Method for Automatically Determining Relationships between Software Artifacts Using Multiple Evidence Sources" The disclosure of the aforementioned Provisional Patent Application Ser. No. 60/853,292 is expressly incorporated herein by reference in its entirety.

FIELD OF THE INVENTION

The present invention relates to the electrical, electronic, and software arts, and, more particularly, to techniques for software traceability.

BACKGROUND OF THE INVENTION

Software traceability is important in attaining effective end-to-end software engineering. Indeed, it is a significant factor in conducting and achieving a wide range of activities and goals, including tool integration, propagation of change, impact of change analysis, task assistance and semi-automation, consistency management, IT governance, and process assessment. Yet the software traceability problem has remained among the most intractable of problems for more than two decades. There are at least two issues that contribute to this intractability. First, people remain largely unmotivated to provide and evolve traceability information, as the stakeholder who knows the information is rarely the one who benefits from it. Second, even if the people were motivated, it is not feasible for humans to define and maintain traceability information throughout the course of evolution. There are too many stakeholders, too many software artifacts, too much evolution, and far too many interrelationships for this task to be addressed entirely by people.

Accordingly, automation has been attempted in the area of software traceability. Numerous researchers have attempted to automate the identification of artifact interrelationships, using a wide variety of techniques. These attempts have all experienced significant problems with scalability, reliability, correctness and usability and, as a result, none of them are currently in use in any real-world applications. Prior techniques have typically demonstrated different cost-benefit tradeoffs, particularly with respect to performance, precision, and recall. None of the techniques used have been considered efficient and reliable enough for use in real software processes. The limited sets of tools that developers have been offered to utilize traceability information have also demonstrated poor functional and usability characteristics. Fully automating the identification and evolution of interrelationships has not been possible, given that some relationship semantics are implicit and depend on human knowledge.

It would be desirable to overcome the limitations in previous approaches.

SUMMARY OF THE INVENTION

Principles of the present invention provide techniques for automatically determining relationships between software artifacts using multiple evidence sources. In one aspect, an exemplary method (which can be computer implemented) of inferring whether at least a first relationship exists between at least first and second entities includes the steps of applying a first assessor to obtain a first confidence level pertaining to putative existence of the at least first relationship between the at least first and second entities, applying a second assessor to obtain a second confidence level pertaining to putative existence of the at least first relationship between the at least first and second entities, and combining the first and second confidence levels to obtain an overall inference whether the at least first relationship exists between the at least first and second entities. The "entities" can include, by way of example and not limitation, one or more of software artifacts (further discussion is provided below), stakeholders, and tasks.

Information about one or more of assessors, relationships, and entities can be obtained by active and/or passive techniques. In one or more instances, steps are performed by a software tool (with human intervention as appropriate). Such tool can advantageously facilitate editing of the obtained information. A given pair of entities can be identified. These can be any two entities where we wish to check for the existence of one or more relationships between such entities. Two or more assessors are applied to obtain confidence levels in the existence of one or more relationships (for example, the at least first relationship mentioned above). In one simple case, we apply first and second assessors, but there is no limit to the number of assessors that can be applied, so that an additional step of can be performed of applying a plurality of additional assessors to obtain a plurality of additional confidence levels pertaining to putative existence of the at least first relationship between the at least first and second entities. In such a case, where additional assessors are employed, the step of combining the first and second confidence levels further includes combining the plurality of additional confidence levels to obtain the over all inference regarding the given candidate relationship.

Note that we can use more than two assessors, we can look for additional types of relationships between the same two entities, and we can look for the same or different relationships between additional entities. Thus, we can check whether there are one or more additional possible types of relationships between the two entities that were identified. If this is the case, appropriate steps can be repeated for such additional possible relationship(s). If such is not the case, a determination can be made whether we wish to examine one or more additional pairs of entities for the existence of one or more possible relationships. If such is the case, we identify another given pair of entities, and proceed as before. However, if we do not wish to examine additional entities, we can form a graph-like representation, as discussed below.

In one instance we could apply a third assessor to obtain a third confidence level pertaining to putative existence of at least a second relationship between the at least first and second entities, and could also apply a fourth assessor to obtain a fourth confidence level pertaining to putative existence of the at least second relationship between the at least first and second entities. We can combine the third and fourth confidence levels to obtain an overall inference whether the at least second relationship exists between the at least first and second entities. The third and fourth assessors are typically different than the first and second assessors, because we are looking for a different kind of relationship, but the invention is not limited to such case, as it is possible to have two assessors that are essentially the same but infer different relationships.

Further, in one instance, we could apply the first assessor to obtain a third confidence level pertaining to putative existence of the at least first relationship between at least third and fourth entities, and could also apply the second assessor to obtain a fourth confidence level pertaining to putative existence of the at least first relationship between the at least third and fourth entities. We could then combine the third and fourth confidence levels to obtain an overall inference whether the at least first relationship exists between the at least third and fourth entities. Of course, additional pairs can be examined for the same or different relationships than other pairs, depending on the types of relationships possible between the particular pair.

Thus, the described steps can be repeated for a plurality of additional entities and relationships. As noted, an additional step can include forming a graph-like representation depicting the relationships among the entities. We use the term "graph-like" rather than web-like to avoid confusion with the world-wide-web. The term "network" is also appropriate to refer to the representation. Another additional step can include updating the graph-like representation to reflect changes in the relationships. In one or more instances, at least some of the changes in the relationships result from changes in at least some of the entities.

As noted, in one or more embodiments, all of the steps are performed by a software tool (understood to include the possibility of human input to the tool as appropriate). In one or more instances, such a tool could include, by way of example and not limitation, one or more of (i) a list of candidate types of relationships including at least the first relationship and the second relationship, and (ii) a list of assessors for each of the candidate types of relationships, the list including at least the first and second assessors for the first relationship and the third and fourth assessors for the second relationship. In this case, an additional step could include facilitating editing of both the list of candidate types of relationships and the list of assessors for each of the candidate types of relationships by a user of the tool.

In the case where the entities awe software artifacts, one non-limiting example of the at least first relationship is a "tests" relationship, that is, one artifact tests another artifact (specific non-limiting examples will be given below). In such case, the first assessor could be, by way of example and not limitation, a create-time assessor, a name matching assessor, a control flow assessor, a user interaction assessor, or a preceding version assessor. The second assessor would be a different assessor than the first assessor, again, by way of example and not limitation, a different assessor selected from the list in the prior sentence. Another possible example of a relationship between software artifacts is an "implements" relationship, discussed farther below.

In a preferred approach, the combining step includes performing a summation discussed hereinbelow. In an alternative approach to the combining step, each of the first assessor, the second assessor, and the plurality of additional assessors represents the confidence levels as one of n discrete logical values, and the combining step includes a logical combination of the n discrete logical values. In one specific example, this can be done according to a 5-valued logic, such as "definitely," "probably," "possibly," "definitely not," and "inconsistent." In this alternative example, weights are not employed.

As noted, information about one or more of assessors, relationships, and entities can be obtained by active and/or passive techniques. In general terms, regardless of whether active or passive techniques are employed, one or more steps can be repeated in a pair-wise manner for a plurality of additional entities and relationships. For each of the pairs of entities, additional steps to be performed can include determining which of a plurality of candidate relationships can apply to a given one of the pairs of entities, and determining which of a plurality of candidate assessors can apply to a given one of the plurality of candidate relationships for the given one of the pairs of entities.

In another aspect, an exemplary method of building a database associated with a central authority, the database comprising at least a plurality of candidate relationships and a plurality of candidate assessors, includes the steps of (i) facilitating registration of the plurality of candidate assessors with the central authority and (ii) facilitating registration of the plurality of candidate relationships. The registration of the plurality of candidate assessors includes data regarding which of the plurality of candidate relationships a given one of the candidate assessors is capable of assessing. The registration of the plurality of candidate relationships includes data regarding which kinds of entities a given one of the candidate relationships can apply to.

In yet another aspect, an exemplary method of building a database associated with a relationship manager program, the database comprising at least a plurality of candidate relationships and a plurality of candidate assessors, includes the steps of facilitating registration of the plurality of candidate assessors with the manager program, based at least in part upon input from human experts having assessor-related knowledge, and facilitating registration of the plurality of candidate relationships with the manager program, based at least in part upon input from human relationship experts having relationship-related knowledge. The registration of the plurality of candidate assessors includes at least indications of which of the plurality of candidate assessors can assess which kinds of the candidate relationships. The registration of the plurality of candidate relationships including at least indications of which of the plurality of candidate relationships can apply to given pairs of the plurality of entities.

One or more embodiments of the invention or elements thereof can be implemented in the form of a computer product including a computer usable medium with computer usable program code for performing the method steps indicated. Furthermore, one or more embodiments of the invention or elements thereof can be implemented in the form of an apparatus including a memory and at least one processor that is coupled to the memory and operative to perform exemplary method steps.

These and other features, aspects, and advantages of the present invention will become apparent from the following detailed description of illustrative embodiments thereof, which is to be read in connection with the accompanying drawings.

DETAILED DESCRIPTION OF PREFERRED EMBODIMENTS

One or more embodiments of the invention can help developers manage software complexity by offering semi-automated support for capturing and mining relationships among artifacts and/or developer tasks at different stages of the software lifecycle. Developers can then use and manage information contained in the relationships. The use of these relationships can, in one or more instances, facilitate one or more of traceability, propagation of change, change impact analysis, evolution, and comprehension. As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data. Or commands to cause or aid the action to be performed.

Figure 1:
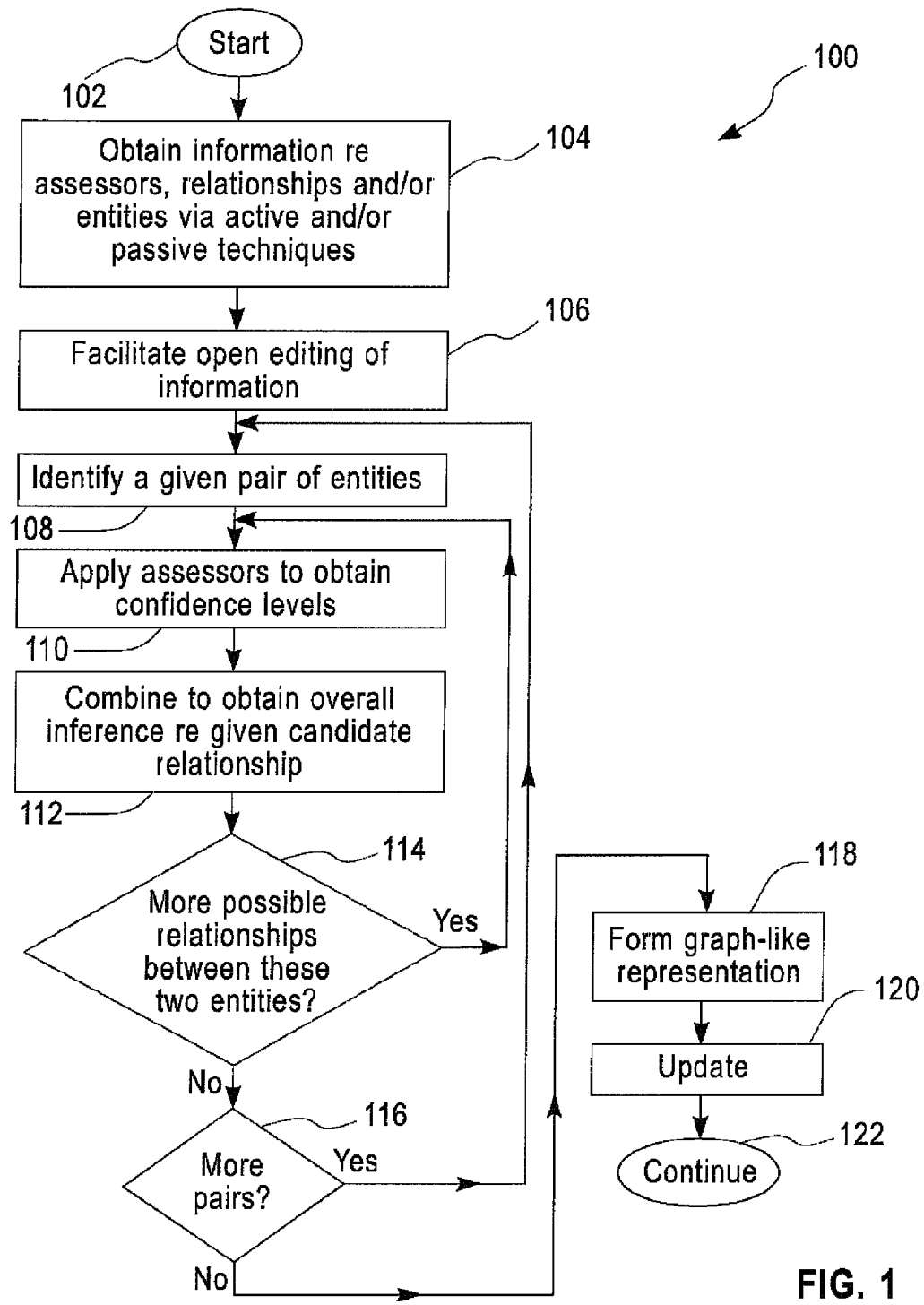
FIG. 1 shows a flow chart of exemplary method steps according to an aspect of the invention.

Referring to FIG. 1, flow chart 100 shows steps in an exemplary method, according to an aspect of the invention, of inferring whether at least a first relationship exists between at least first and second entities. The method is preferably substantially computer-implemented with human intervention as appropriate. The method includes, in general terms, the steps of applying a first assessor to obtain a first confidence level pertaining to putative existence of the at least first relationship between the at least first and second entities; applying a second assessor to obtain a second confidence level pertaining to putative existence of the at least first relationship between the at least first and second entities; and combining the first and second confidence levels to obtain an over all inference whether the at least first relationship exists between the at least first and second entities. The steps of applying the first and second assessors are shown in block 110 of flow chart 100, and the combining step is depicted in block 112.

The "entities" can include, by way of example and not limitation, one or mole of software artifacts (further discussion is provided below), stakeholders, and tasks.

The flow chart 100 will now be described in detail. After beginning at start block 102, step 104 includes determining information about one or more of assessors, relationships, and entities. As will be discussed herein, such information can be obtained by active and/or passive techniques. As will be discussed further below, in one or more instances, steps we performed by a software tool (with human intervention as appropriate). Such tool can advantageously facilitate editing of the information obtained in step 104, as shown at step 106. At step 108, a given pair of entities can be identified. These can be any two entities where we wish to check for the existence of one or more relationships between such entities. As noted, at block 110, we apply two or more assessors to obtain confidence levels in the existence of one or more relationships (for example, the at least first relationship mentioned above). In one simple case, we applied first and second assessors, but there is no limit to the number of assessors that can be applied, so that an additional step of can be performed of applying a plurality of additional assessors to obtain a plurality of additional confidence levels pertaining to putative existence of the at least first relationship between the at least first and second entities. In such a case, where additional assessors are employed, the step of combining the first and second confidence levels further includes combining the plurality of additional confidence levels to obtain the overall inference regarding the given candidate relationship, as shown in step 112.

Note that, for purposes of linguistic brevity, mention is made of "we applied," "we wish" and so on; use of "we" does not necessarily imply human agency but is intended to also cover steps performed automatically, such as by the aforementioned software tool.

Note that we can use more than two assessors, we can look for additional types of relationships between the same two entities, and we can look for the same or different relationships between additional entities. Thus, decision block 114 involves checking whether there are one or more additional possible types of relationships between the two entities that were identified in step 108. If this is the case, as per the "YES" branch of block 114, steps 110 and 112 can be repeated for such additional possible relationship(s). If such is not the case, as per the "NO" branch of block 114, another decision block can be executed, as at block 116. Here, a determination is made whether we wish to examine one or more additional pairs of entities for the existence of one or more possible relationships. If such is the case, as per the "YES" branch of block 114, we proceed to block 108 and identify another given pair of entities, and proceed as before. However; if we do not wish to examine additional entities, as pet the "NO" branch of block 116, we move on to block 118, as discussed further below.

Thus, in one instance of the "YES" blanch of block 114, we could apply a third assessor to obtain a third confidence level pertaining to putative existence of at least a second relationship between the at least first and second entities, and could also apply a fourth assessor to obtain a fourth confidence level pertaining to putative existence of the at least second relationship between the at least first and second entities. We can combine the third and fourth confidence levels to obtain an overall inference whether the at least second relationship exists between the at least first and second entities. The third and fourth assessors are typically different than the first and second assessors, because we are looking for a different kind of relationship, but the invention is not limited to such case, as it is possible to have two assessors that are essentially the same but infer different relationships.

Further, in one instance of the "YES" branch of block 116, we could apply the first assessor to obtain a third confidence level pertaining to putative existence of the at least first relationship between at least third and fourth entities, and could also apply the second assessor to obtain a fourth confidence level pertaining to putative existence of the at least first relationship between the at least third and fourth entities. We could then combine the third and fourth confidence levels to obtain an overall inference whether the at least first relationship exists between the at least third and fourth entities. Of course, additional pairs can be examined for the same or different relationships than other pairs, depending on the types of relationships possible between the particular pair.

Thus, the described steps can be repeated for a plurality of additional entities and relationships. As per block 118, an additional step can include forming a graph-like representation depicting the relationships among the entities. We use the term "graph-like" rather than web-like to avoid confusion with the world-wide-web. The term "network" is also appropriate to refer to the representation. As per block 120, another additional step can include updating the graph-like representation to reflect changes in the relationships. In one or more instances, at least some of the changes in the relationships result from changes in at least some of the entities.

As noted, in one or more embodiments, all of the steps are performed by a software tool (understood to include the possibility of human input to the tool as appropriate). In one or more instances, such a tool could include, by way of example and not limitation, one or more of (i) a list of candidate types of relationships including at least the first relationship and the second relationship, and (ii) a list of assessors for each of the candidate types of relationships, the list including at least the first and second assessors for the first relationship and the third and fourth assessors for the second relationship. In this case, an additional step could include facilitating editing of both the list of candidate types of relationships and the list of assessors for each of the candidate types of relationships by a user of the tool. One example of this step is block 106 of flow chart 100.

In the case where the entities are software artifacts, one non-limiting example of the at least first relationship is a "tests" relationship, that is, one artifact tests another artifact (specific non-limiting examples will be given below). In such case, the first assessor could be, by way of example and not limitation, a create-time assessor, a name matching assessor, a control flow assessor, a user interaction assessor; or a preceding version assessor. The second assessor would be a different assessor than the first assessor, again, by way of example and not limitation, a different assessor selected from the list in the prior sentence. Another possible example of a relationship between software artifacts is an "implements" relationship, discussed further below.

In a preferred approach, the combining step 112 includes performing the summation:

$$\sum_{n=1}^{N} (V_n \cdot w_n) \quad (1)$$

where:

each of the first assessor; the second assessor, and the plurality of additional assessors represents the confidence levels as a value, $V_n$, between zero and one, with n indicating an nth one of the assessors, $w_n$ is a weight for the nth one of the assessors, and N=the total number of assessors.

In one or more instances, the weights are all between 0 and 1 and sum to 1; in one or more instances, weights are assigned uniformly (that is, $w_n$=1/N).

In an alternative approach to the combining step 112, each of the first assessor, the second assessor, and the plurality of additional assessors represents the confidence levels as one of n discrete logical values, and the combining step includes a logical combination of the n discrete logical values. In one specific example, this can be done according to a 5-valued logic, such as "definitely," "probably," "possibly," "definitely not," and "inconsistent." In this alternative example weights are not employed.

As noted, step 104 includes determining information about one or more of assessors, relationships, and entities, and such information can be obtained by active and/or passive techniques. In general terms, regardless of whether active or passive techniques are employed, one or more steps in FIG. 1 can be repeated in a pair-wise manner for a plurality of additional entities and relationships (as pet the discussion of decision blocks 114 and 116). For each of the pairs of entities, additional steps to be performed can include determining which of a plurality of candidate relationships can apply to a given one of the pairs of entities, and determining which of a plurality of candidate assessors can apply to a given one of the plurality of candidate relationships for the given one of the pairs of entities.

Where an active technique is employed, the candidate relationships and the candidate assessors can be obtained by performing the steps of facilitating registration of the plurality of candidate assessors with a central authority and facilitating registration of the plurality of candidate relationships. The registration of the plurality of candidate assessors can include data regarding which of the plurality of candidate relationships a given one of the candidate assessors is capable of assessing. The registration of the plurality of candidate relationships can include data regarding which kinds of entities a given one of the candidate relationships can apply to. In some instances, the registration of the plurality of candidate assessors further includes data regarding which kinds of entities a given one of the candidate assessors is capable of assessing.

Stated in another way, in an exemplary active approach, one finds the two entities to be checked, looks up what type of entities they are, and sees what kinds of relationships can exist between those kinds of entities, and what kinds of assessors can assess those kinds of relationship(s). An assessor can "declare" the types of relationships it knows how to assess and different types of relationships can be registered, and the types of the entities that such relationships can apply to can also be registered. Assessors are typically registered by the type of relationships they know how to assess, and registration by the types of entities they know how to assess may also be useful The active approach can be conducted in conjunction with other method steps, or as an independent method, or as some combination thereof. Thus, an exemplary method of building a database associated with a central authority, the database comprising at least a plurality of candidate relationships and a plurality of candidate assessors, includes a step of facilitating registration of the plurality of candidate assessors with the central authority. The registration of the plurality of candidate assessors includes data regarding which of the plurality of candidate relationships a given one of the candidate assessors is capable of assessing. The method also includes the step of facilitating registration of the plurality of candidate relationships. The registration of the plurality of candidate relationships includes data regarding which kinds of entities a given one of the candidate relationships can apply to. Optionally, the registration of the plurality of candidate assessors further includes data regarding which kinds of entities a given one of the candidate assessors is capable of assessing.

An exemplary passive technique will now be discussed. In one or more instances, there are human experts that understand what the relationships are and which assessors to apply to assess them. The relationships and assessors can be registered. Assessors are built to assess whether a given relationship holds between two elements. Such relationships only make sense between elements of a certain type (for example, the relationship "FatherOf" only makes sense between two people; not between a person and an inanimate object). When an element is created or changed in the system, it is advantageous to be able to determine the relationships in which it participates. A manager program can be notified of such create and/or change events, and can apply any applicable assessors between the new element and other elements to create the necessary relationships. Since not all assessors assess relationships that make sense fox that type of element, the manager program is advised which ones do (that is, which ones are applicable) through a registration process. The decision about which assessors should be registered as applicable to which types of elements can be made by a human being who programs it into the system.

Thus, in an exemplary passive technique, the candidate relationships and the candidate assessors are obtained by performing the steps of facilitating registration of the plurality of candidate assessors with a manager program and facilitating registration of the plurality of candidate relationships with the manager program. The facilitating registration of the plurality of candidate assessors with the manager program can be based, at least in part, upon input from human experts having assessor-related knowledge. The registration of the plurality of candidate assessors can include at least indications of which of the plurality of candidate assessors can assess which kinds of the candidate relationships. The facilitating registration of the plurality of candidate relationships with the manager program can be based, at least in part, upon input from human relationship experts having relationship-related knowledge. The registration of the plurality of candidate relationships can include at least indications of which of the plurality of candidate relationships can apply to given pairs of the plurality of entities. The determining which of the plurality of candidate relationships can apply to a given one of the pails of entities and the determining which of the plurality of candidate assessors can apply to a given one of the plurality of candidate relationships for the given one of the pairs of entities can be done by executing the manager program (refer to exemplary discussion of element 718 in FIG. 7 below).

The passive approach can be conducted in conjunction with other method steps, or as an independent method, or as some combination thereof. Thus, an exemplary method of building a database associated with a relationship manager program, the database comprising at least a plurality of candidate relationships and a plurality of candidate assessors, includes a step of facilitating registration of the plurality of candidate assessors with the manager program, based at least in part upon input from human experts having assessor-related knowledge. The registration of the plurality of candidate assessors includes at least indications of which of the plurality of candidate assessors can assess which kinds of the candidate relationships. The method also includes the step of facilitating registration of the plurality of candidate relationships with the manager program, based at least in part upon input from human relationship experts having relationship-related knowledge. The registration of the plurality of candidate relationships includes at least indications of which of the plurality of candidate relationships can apply to given pairs of the plurality of entities.

Based on the description thus far, it will be appreciated that one or more inventive embodiments advantageously find the "sweet spot" between (i) manual input from the user and (ii) automation, by leveraging information about the stakeholders' tasks. The herein-described traceability relationship identification and evolution technique can be referred to as semi-automated relationship inferencing (SARI), and can cover both the initial identification of these relationships, as well as the removal of relationships when they become, for example, incorrect, useless, or irrelevant. Traceability relationships include, for example, the relationship between code and the design it implements, between a test case and the code it tests, and between a design and the use case(s) it realizes. One or more inventive embodiments can address a subset of common traceability relationships. SARI can, in one or more embodiments, exhibit one or mole of the following characteristics:

For each type of relationship, multiple techniques are combined, according to one or more inventive aspects disclosed herein, to identify new relationships and discard invalid ones. In this way, one or more embodiments leverage the best features of a variety of techniques to produce better results, while minimizing their individual weaknesses. Moreover, the architecture is open and extensible—new techniques can be incorporated at any time.

Relationships between existing artifacts are identified (not just when artifacts are created) so no unrealistic assumptions about starting from scratch need be made. Relationships can also be captured during the artifact creation process, a time when more information is often available to help with the creation of such relationships. For example, it is easy to tell which code is being tested at the point where a developer creates a test case for that code. It is comparatively more difficult to determine this information once the test case exists.

One or more embodiments of SARI assign qualitative "goodness" ratings to each relationship, as well as an explanation for why it is believed that the relationship is valid. This enables stakeholders to understand and control the tradeoff between completeness and accuracy.

One or more embodiments feature incrementally and scalability.

When one or more embodiments of the semi-automated inferencing engine identify problematic relationships (ones they cannot resolve by themselves), help can be solicited from the user, preferably in a non-intrusive, focused manner, thus minimizing the amount of effort an unwilling stakeholder has to put into maintaining traceability information. By combining a variety of novel and user-friendly techniques, one or more inventive embodiments help stakeholders to develop, evolve, and use traceability effectively to manage software complexity. Semi-automated support can be provided for capturing and mining relationships among artifacts and/or developer tasks at different stages of the software lifecycle, and this can help stakeholders to use these relationships to facilitate one or more of traceability, propagation of change and change impact analysis, evolution, task assistance and semi-automation, assessment, and comprehension.

Figure 2:
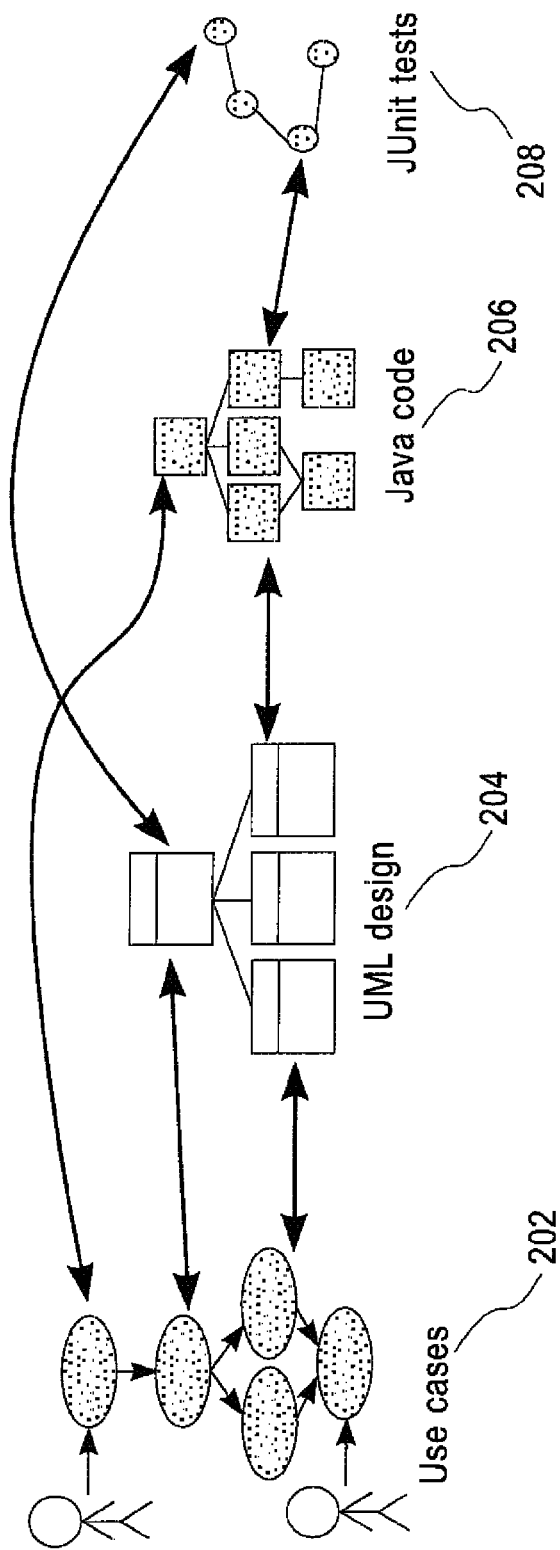
FIG. 2 illustrates exemplary traceability relationships, according to an aspect of the invention.

Further discussion will now be provided regarding application of exemplary inventive techniques to the software lifecycle. As discussed above, relationships among entities may be inferred. Exemplary types of entities include stakeholders, software artifacts, and tasks. This list is not intended to be limiting. Software artifacts can include, by way of example and not limitation, products of a piece of work, such as a word processing document, a presentation, a spreadsheet, and so on. In general, an artifact is a result of some process. Processes can include software development, governmental processes, mathematical processes, scientific processes, and so on; indeed, anything that can be represented in some accessible medium. We seek to determine whether relationships exist between artifacts; for example, between two stakeholders, between a stakeholder and an artifact, between a task and a stakeholder who performs it, between a task and an artifact, between two tasks, and so on. Traceability relationships in the software lifecycle thus relate corresponding artifacts across phases of the lifecycle and across artifact versions. With reference to FIG. 2, a plurality of use cases 202 may lead to a plurality of model designs 204, for example in the UML unified modeling language. These model designs may in turn lead to JAVA code 206 and associated JUnit test cases 208. (JAVA is a general-purpose, class-based, object-oriented language.) JUnit is a well-known simple framework for writing repeatable tests and is an instance of the XUnit architecture.

By way of a simple example, we might have two word processing documents. We seek to determine if they are related, and, if so, what kind of relationship(s) exist. For example, if the two entities were people, they might have the relationship father of child, husband of wife, employee of employer, and so on. The different techniques for determining whether a particular relationship exists have been referred to herein as assessors. In the case of the two word processing documents, exemplary assessors could include natural language analysis of the contents, or the structure of the documents, and so on. Thus, in one or more instances, implicit relationships between entities are found, made explicit, and connected up into a graph-like structure.

Figure 3:
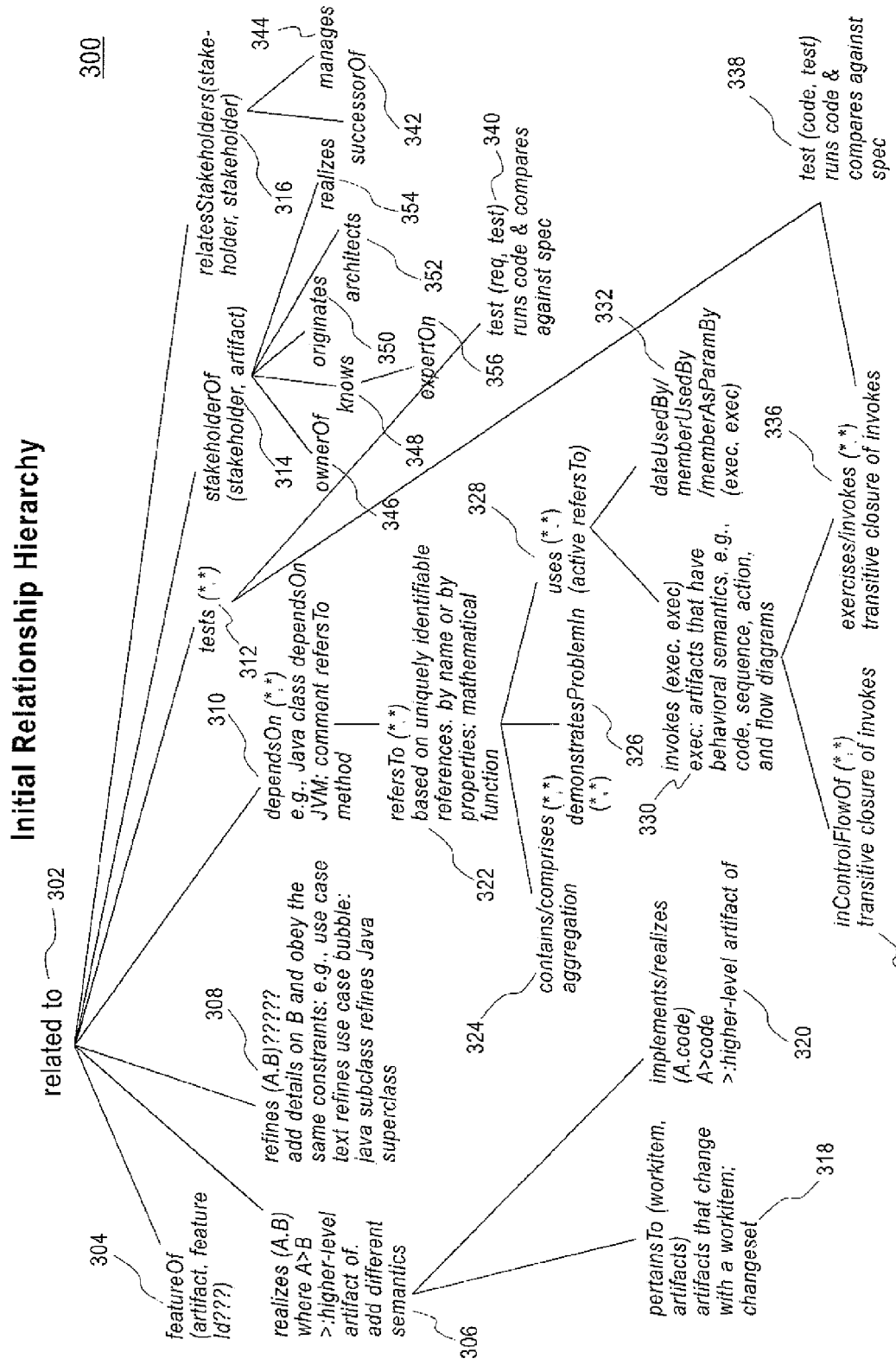
FIG. 3 illustrates an exemplary initial relationship hierarchy, according to another aspect of the invention.

Additional non-limiting examples of entities, relationships, and assessors will now be provided. With reference to FIG. 3, an initial relationship hierarchy 300 begins with the most general case of "related to," at location 302. A next level includes the possible relationships "feature of," "realizes," "refines," "depends on," "tests," "stakeholder of," and "relates stakeholders," labeled 304 through 316 respectively. Location 306 branches out to "pertains to" 318 and "implements/realizes" 320. "Depends on" 310 branches to "refers to" 322 which in turn branches to "contains/comprises" 324, "demonstrates problem in" 326, and "uses" 328. The latter in turn branches to "invokes" 330 and "data used by/member used by" 332. "Invokes" 330 branches to "in control flow of" 334 and "exercises/invokes" 336. "Test (code, test)" 338 is a branch of both 336 and 312. "Test (req, test)" 340 is a branch of 312.

Still referring to FIG. 3, relationship 316 branches to "successor of" 342 and "manages" 344. Relationship 314 branches to "owner of" "knows," "originates," "architects," and "realizes," 346-354 respectively "Knows" 348 can include "expert on" 356.

Figure 4:
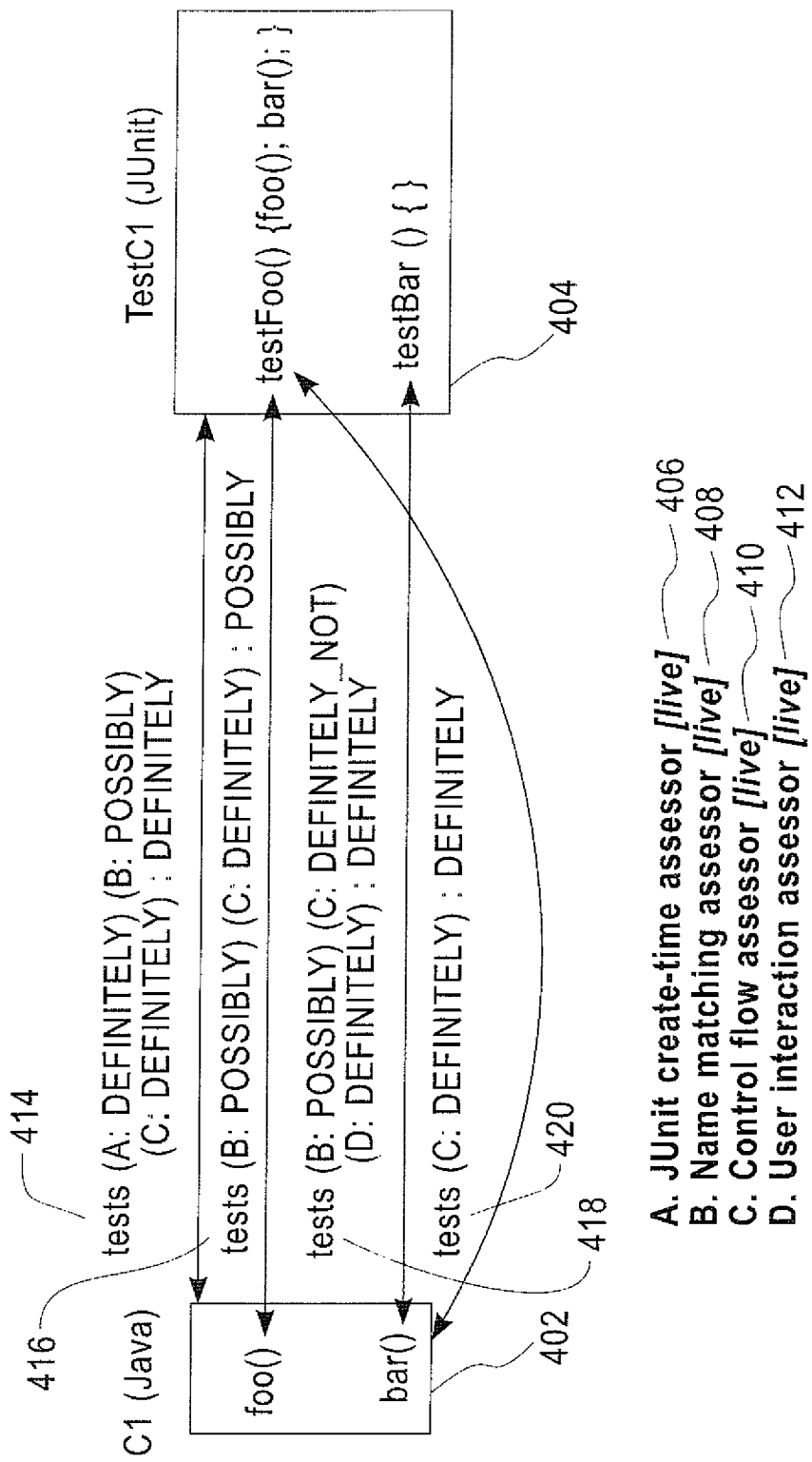
FIG. 4 illustrates an exemplary examination for a "tests" relationship, according to one exemplary application of an embodiment of the invention.

With reference now to FIG. 4, consider the "tests' relationship 312. This relationship can be between a piece of source code, such as "C1" code 402, and the test case, such as "TestC1" 404, that tests it to see if it is correct. Many different types of assessors could be used to see if such a relationship exists, for example, an "invokes" assessor sees whether the test case invokes the method in the source code and a "name-matching" assessor sees if the names indicate a relationship. There may be a standard naming convention, such that, for example, "test" is pre-pended to the name of the code segment to be tested to get the name of the test case for that segment. A "control flow" assessor checks whether anything that the test case calls, whether directly or indirectly, is in the source code; if so, a relationship exists. An "implements" assessor sees whether the real code implements the "sketch" of the code. A model or sketch is often made of code before actual code is written. Such model or sketch may be similar to a "storyboard" and can include, for example, pseudocode (or may be even less concrete than pseudocode). The models or sketches are often created in one tool and the actual code in another tool. The "implements" assessor, finds such connections by, for example, inferring a connection between a sketch or model of a class, and the actual class. A "user interaction" assessor allows a human user to advise whether a relationship exists. Yet another possible assessor is a "preceding version" assessor which sees whether there was a relationship of the given kind between previous versions of the given elements. This particular assessor may be relatively weak.

In the example of FIG. 4, four assessors are employed, namely, JUnit create-time assessor 406, labeled "A," name matching assessor 408, labeled "B," control flow assessor 410, labeled "C," and user interaction assessor 412, labeled "D" The JUnit create-time assessor is an example of a highly reliable assessor; in the Eclipse software environment, when a JUnit test case is created, one can specify at such time exactly what JAVA code it is intended to test. Here, as indicated at 414, assessors A, B and C are run to see if a "tests" relationship exists between C1 and TestC1; they indicate, respectively, "definitely," "possibly," and "definitely" and are combined to yield an overall score of "definitely." Then, at 416, we examine for a "tests" relationship between "foo" and testFoo" Assessors B and C yield, respectively, "possibly" and "definitely," resulting in an overall assessment of "possibly." At 418, we look for a "tests" relationship between "bar" and TestBar" Assessors B, C and D yield, respectively, "possibly," "definitely not," and "definitely," resulting in an overall assessment of "definitely." Finally, at 420, we look for a "tests" relationship between "bar" and "testFoo." Assessor C yields a result of "definitely" leading to an overall conclusion of "definitely."

Figure 5:
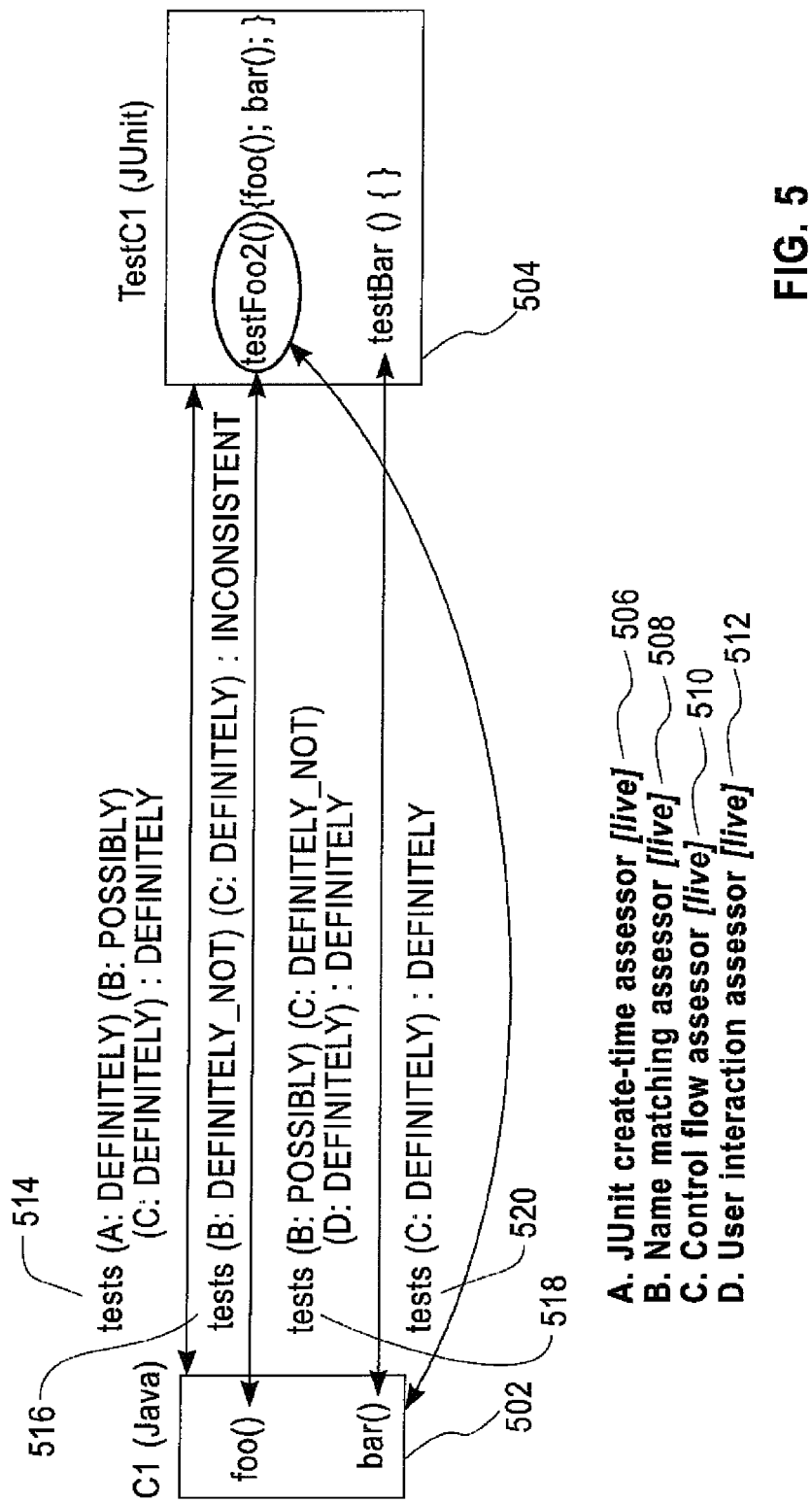
FIG. 5 is a view similar to FIG. 4, for the case of an evolving relationship.

As noted, one or more inventive embodiments lead to a map of relationships between entities. Updates over time can be detected. For example, if one married one's fiancé, the relationship would change from "fiancé" to "spouse." Changes in relationships may be a result of changes in entities themselves, for example, editing the word processing document in the above examples. Attention should now be given to FIG. 5, which is similar to FIG. 4, except as described hereinafter. Elements in FIG. 5 similar to those in FIG. 4 have received the same reference character incremented by 100, and will not be described again except to the extent that they differ substantially form those in FIG. 4. FIG. 5 shows one example of how inventive techniques can be applied to relationships that evolve over time. Here, "testFoo" has been renamed to "testFoo2." Now the name matching assessor yields "definitely not" while the control flow assessor yields "definitely," and the overall result is "inconsistent," as at 516.

Figure 6:
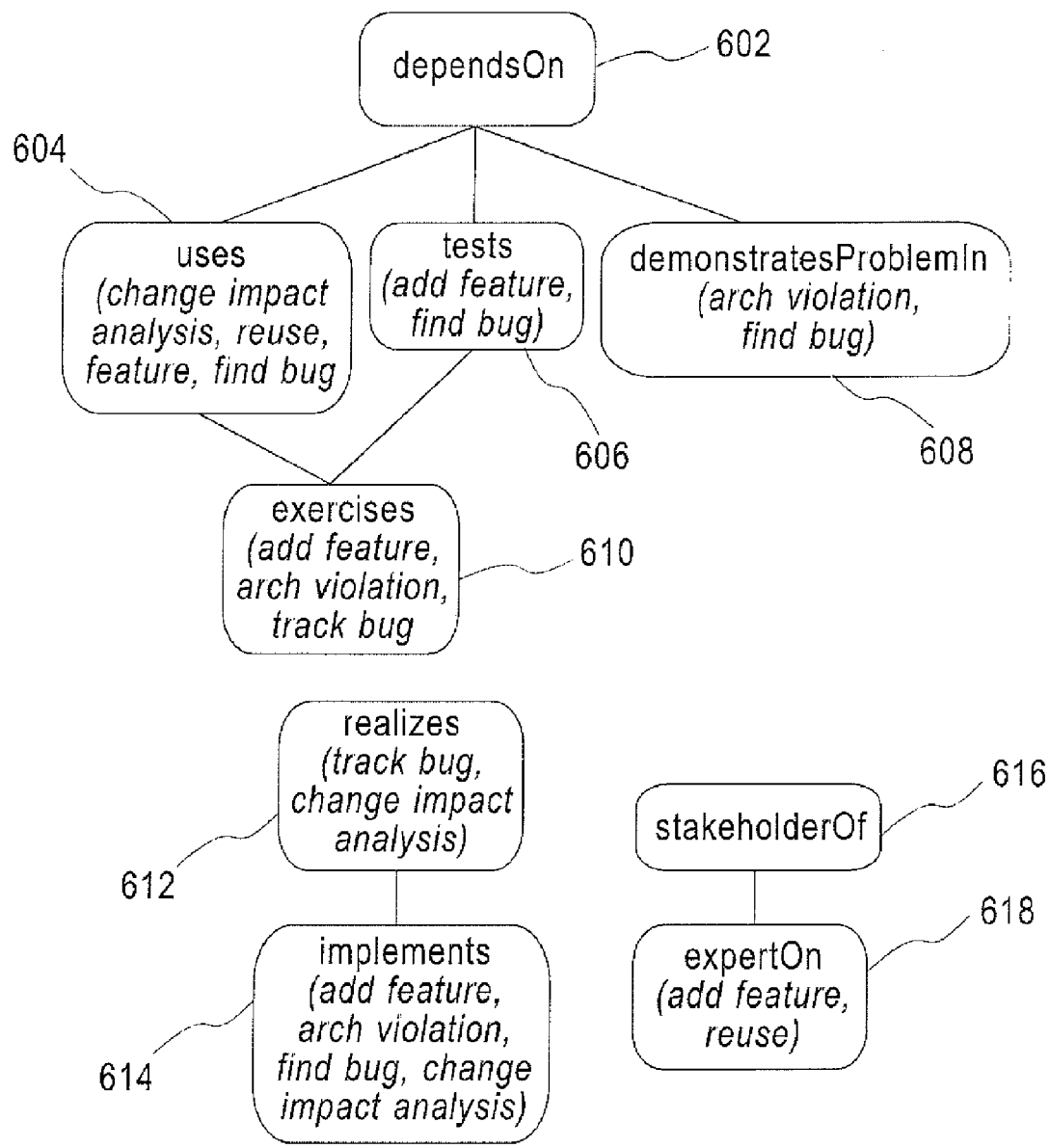
FIG. 6 illustrates exemplary relationships of interest.

FIG. 6 gives some additional specific, non-limiting examples of interesting relationships. The "depends on" relationship 602 includes more specific cases such as "uses" 604, "tests" 606, and "demonstrates problem in" 608. Blocks 604 and 606 can each lead to "exercises" relationship 610. "Implements" 614 is a special case of "realizes" 612, and "expert on" 618 is a special case of "stakeholder of" 616.

An advantage of one or more embodiments of the invention is that the skilled artisan can implement assessors using whatever techniques he or she likes. Advantageously, such embodiment(s) provide such artisans with support in building and running their assessors to do traceability inferencing, regardless of the techniques they choose to do the assessment.

Figure 7:
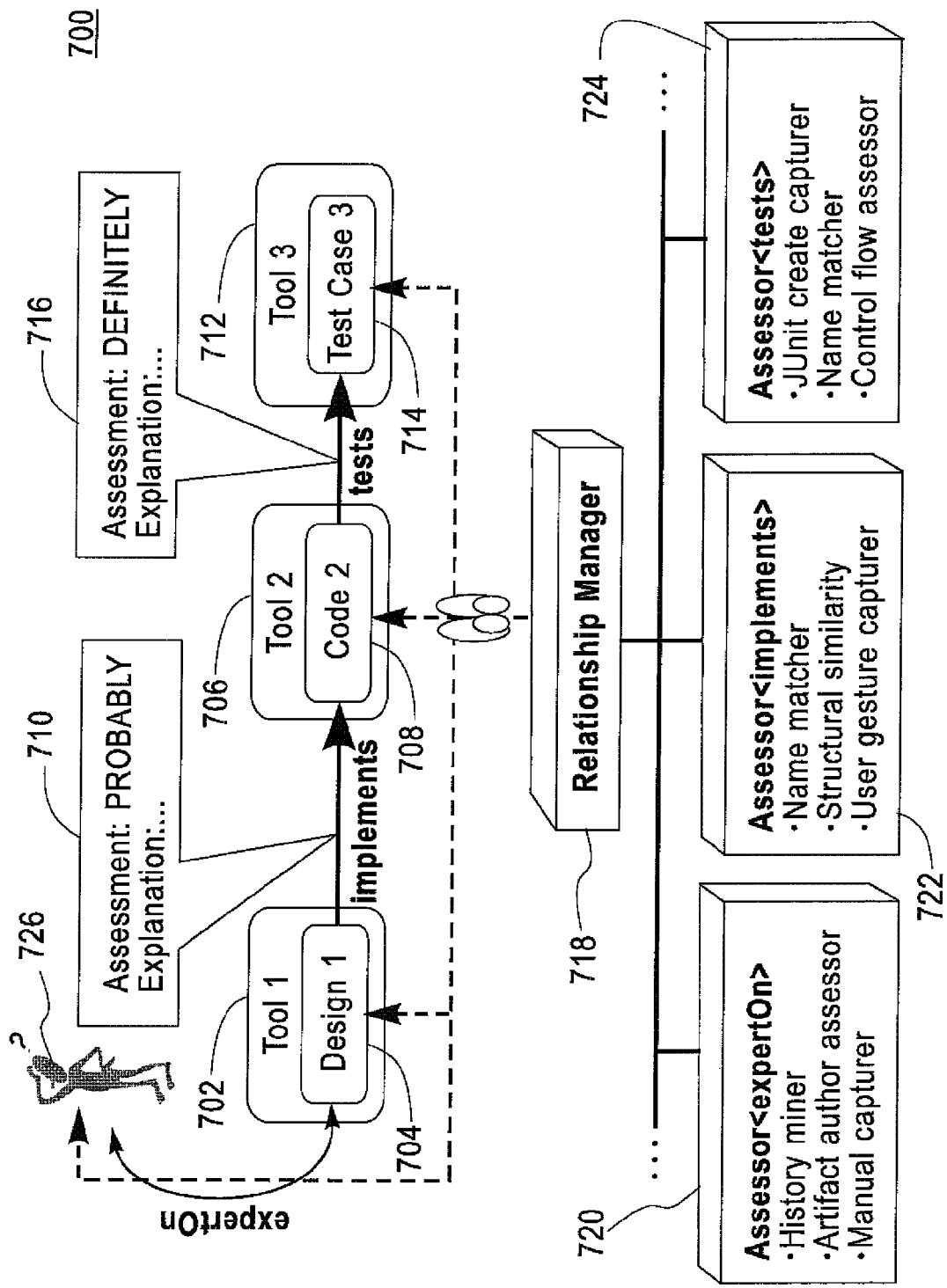
FIG. 7 shows an exemplary high-level architecture that can implement one or more inventive embodiments.

FIG. 7 shows an exemplary system architecture 700 that can be used to implement one or more embodiments of the invention. A first tool 702 creates a design 704, while a second tool 706 creates a code segment 708. We desire to see if block 708 implements 704; as shown at block 710, the overall assessment is "probably" and an appropriate explanation for the result can be displayed, for example, as shown with regard to FIGS. 4 and 5. A third tool 712 creates test case 714 and we seek to determine whether block 714 tests block 708. As per block 716, the overall assessment is "definitely," and again, an appropriate explanation can be displayed. Relationship manager 718 monitors all the just-described elements, and includes, by way of example and not limitation, assessors 720 that can assess the "expert on" relationship, assessors 722 that can assess the "implements" relationship, and assessors 724 that can assess the "tests" relationship. Human expert 726 may have an "expert on" relationship with design 704.

A variety of techniques, utilizing dedicated hardware, general purpose processors, firmware, software, or a combination of the foregoing may be employed to implement the present invention or components thereof. One or more embodiments of the invention, or elements thereof, can be implemented in the form of a computer product including a computer usable medium with computer usable program code for performing the method steps indicated. Furthermore, one or more embodiments of the invention, or elements thereof, can be implemented in the form of an apparatus including a memory and at least one processor that is coupled to the memory and operative to perform exemplary method steps.

Figure 8:
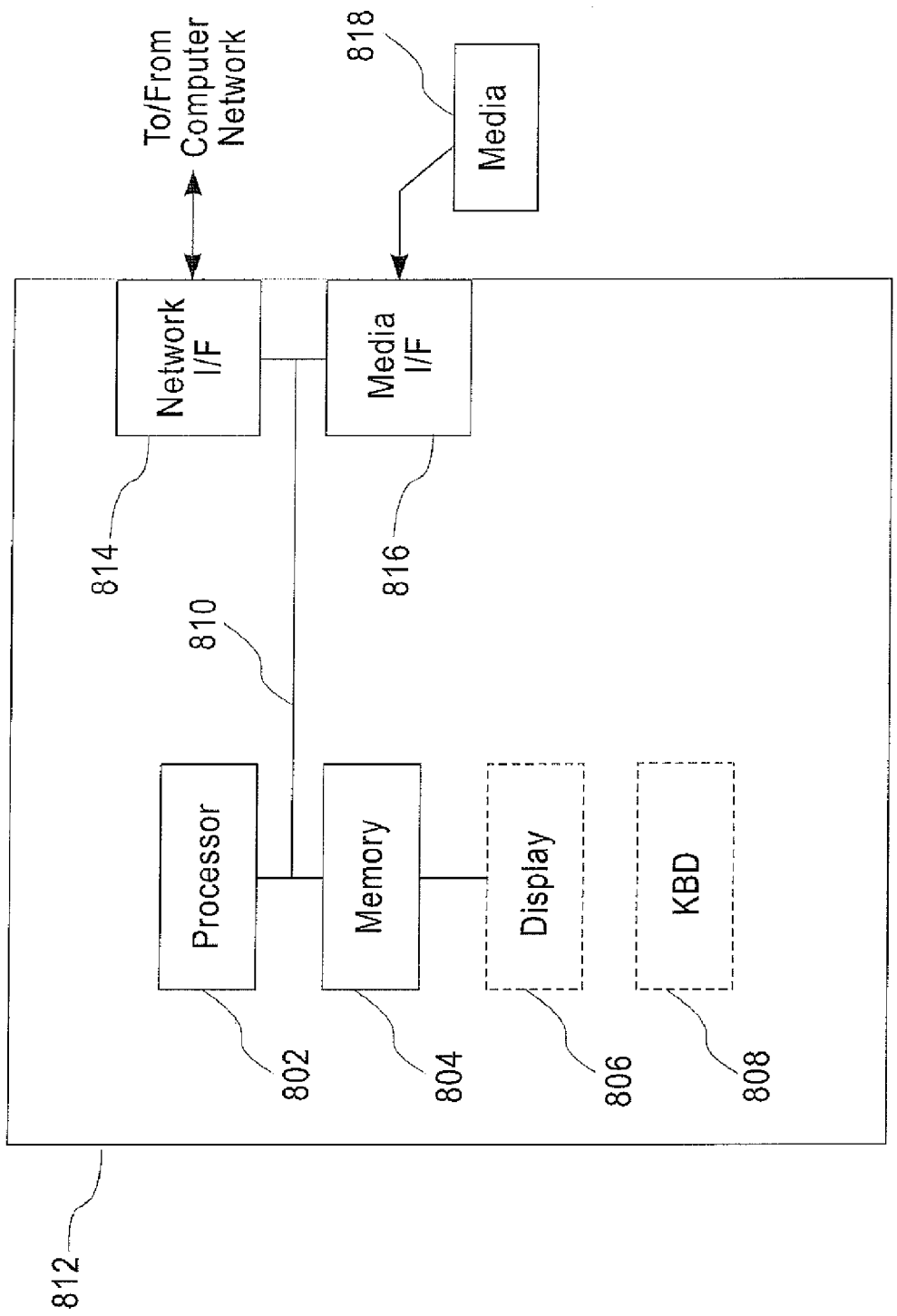
FIG. 8 depicts a computer system that may be useful in implementing one or more aspects and/or elements of the present invention.

One or more embodiments can make use of software running on a general purpose computer or workstation. With reference to FIG. 8, such an implementation might employ, for example, a processor 802, a memory 804, and an input/output interface formed, for example, by a display 806 and a keyboard 808. The term "processor" as used herein is intended to include any processing device, such as, for example, one that includes a CPU (central processing unit) and/or other, forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 802, memory 804, and input/output interface such as display 806 and keyboard 808 can be interconnected, for example, via bus 810 as part of a data processing unit 812. Suitable interconnections, for example via bus 810, can also be provided to a network interface 814, such as a network card, which can be provided to interface with a computer network, and to a media interface 816, such as a diskette or CD-ROM drive, which can be provided to interface with media 818.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and executed by a CPU. Such software could include, but is not limited to, firmware, resident software, microcode, and the like.

Furthermore, the invention can take the form of a computer program product accessible from a computer-usable or computer-readable medium (for example, media 818) providing program code for use by or in connection with a computer or any instruction execution system. For the purposes of this description, a computer usable or computer readable medium can be any apparatus for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory (for example memory 804), magnetic tape, a removable computer diskette (for example media 818), a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor 802 coupled directly or indirectly to memory elements 804 through a system bus 810. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards 808, displays 806, pointing devices, and the like) can be coupled to the system either directly (such as via bus 810) or through intervening I/O controllers (omitted for clarity).

Network adapters such as network interface 814 may also be coupled to the system to enable the data processing system to become coupled to other data processing systems or remote printers or storage devices through intervening private or public networks. Modems, cable modem and Ethernet cards are just a few of the currently available types of network adapters.

In any case, it should be understood that the components illustrated herein may be implemented in various forms of hardware, software, or combinations thereof for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A computer-implemented method of inferring whether at least a first relationship exists between at least first and second entities, said method comprising the steps of:

applying a first assessor to obtain a first confidence level pertaining to putative existence of said at least first relationship between said at least first and second entities;

applying a second assessor to obtain a second confidence level pertaining to putative existence of said at least first relationship between said at least first and second entities; and combining said first and second confidence levels to obtain an overall inference whether said at least first relationship exists between said at least first and second entities, wherein said combining step comprises performing the summation:

$$\sum_{n=1}^{N} (V_n \cdot w_n)$$

where:
  each of said first assessor and said second assessor represents said confidence levels as a value, Vn, between zero and one, with n indicating an nth one of said assessors; $w_n$ is a weight for said nth one of said assessors; and N=a total number of said assessors, wherein N>1;

$$\sum_{n=1}^{N} w_n = 1.$$

2. The method of claim 1, further comprising the additional step of applying a plurality of additional assessors to obtain a plurality of additional confidence levels pertaining to putative existence of said at least first relationship between said at least first and second entities, wherein said step of combining said first and second confidence levels further comprises combining said plurality of additional confidence levels to obtain said overall inference.

3. The method of claim 2, wherein each of said first assessor, said second assessor, and said plurality of additional assessors represents said confidence levels as the value, $V_n$, between zero and one.

4. The method of claim 1, further comprising the additional steps of:
  applying a third assessor to obtain a third confidence level pertaining to putative existence of at least a second relationship between said at least first and second entities;
  applying a fourth assessor to obtain a fourth confidence level pertaining to putative existence of said at least second relationship between said at least first and second entities; and
  combining said third and fourth confidence levels to obtain an overall inference whether said at least second relationship exists between said at least first and second entities.

5. The method of claim 4, wherein all of said steps are performed by a software tool, said tool comprising at least (i) a list of candidate types of relationships including at least said first relationship and said second relationship, and (ii) a list of assessors for each of said candidate types of relationships, said list including at least said first and second assessors for said first relationship and said third and fourth assessors for said second relationship, further comprising the additional step of facilitating editing of both said list of candidate types of relationships and said list of assessors for each of said candidate types of relationships by a user of said tool.

6. The method of claim 1, further comprising the additional steps of:
  applying said first assessor to obtain a third confidence level pertaining to putative existence of said at least first relationship between at least third and fourth entities;
  applying said second assessor to obtain a fourth confidence level pertaining to putative existence of said at least first relationship between said at least third and fourth entities; and
  combining said third and fourth confidence levels to obtain an overall inference whether said at least first relationship exists between said at least third and fourth entities.

7. The method of claim 6, wherein said entities comprise at least software artifacts, stakeholders, and tasks.

8. The method of claim 1, further comprising the additional steps of:
  repeating said steps for a plurality of additional entities and relationships; and
  forming a graph-like representation depicting said relationships among said entities.

9. The method of claim 8, further comprising the additional step of updating said graph-like representation to reflect changes in said relationships.

10. The method of claim 9, wherein at least some of said changes in said relationships result from changes in at least some of said entities.

11. The method of claim 1, wherein:
  said entities comprise software artifacts;
  said at least first relationship comprises a "tests" relationship;
  said first assessor comprises one of a create-time assessor, a name matching assessor, a control flow assessor, a user interaction assessor, and a preceding version assessor; and
  said second assessor comprises another one of a create-time assessor, a name matching assessor, a control flow assessor, a user interaction assessor, and a preceding version assessor.

12. The method of claim 1, wherein:
  said entities comprise software artifacts; and
  said at least first relationship comprises an "implements" relationship.

13. The method of claim 1, further comprising the additional steps of:
  repeating said steps in a pair-wise manner for a plurality of additional entities and relationships; and
  for each of said pairs of entities:
    determining which of a plurality of candidate relationships can apply to a given one of said pairs of entities; and
    determining which of a plurality of candidate assessors can apply to a given one of said plurality of candidate relationships for said given one of said pairs of entities.

14. The method of claim 13, wherein said candidate relationships and said candidate assessors are obtained by performing the steps of:
  facilitating registration of said plurality of candidate assessors with a central authority, said registration of said plurality of candidate assessors including data regarding which of said plurality of candidate relationships a given one of said candidate assessors is capable of assessing;
  facilitating registration of said plurality of candidate relationships, said registration of said plurality of candidate relationships including data regarding which kinds of entities a given one of said candidate relationships can apply to.

15. The method of claim 14, wherein said registration of said plurality of candidate assessors further includes data regarding which kinds of entities a given one of said candidate assessors is capable of assessing.

16. The method of claim 13, wherein:
  said candidate relationships and said candidate assessors are obtained by performing the steps of:
  facilitating registration of said plurality of candidate assessors with a manager program, based at least in part upon input from human experts having assessor-related knowledge, said registration of said plurality of candidate assessors including at least indications of which of said plurality of candidate assessors can assess which kinds of said candidate relationships; and
  facilitating registration of said plurality of candidate relationships with said manager program, based at least in part upon input from human relationship experts having relationship-related knowledge, said registration of said plurality of candidate relationships including at least indications of which of said plurality of candidate relationships can apply to given pairs of said plurality of entities; and said determining which of said plurality of candidate relationships can apply to a given one of said pairs of entities and said determining which of said plurality of candidate assessors can apply to a given one of said plurality of candidate relationships for said given one of said pairs of entities comprises executing said manager program.

17. A computer program product comprising a tangible computer useable readable recordable storage memory including computer usable program code for inferring whether at least a first relationship exists between at least first and second entities, said computer program product including:

computer usable program code for applying a first assessor to obtain a first confidence level pertaining to putative existence of said at least first relationship between said at least first and second entities;

computer usable program code for applying a second assessor to obtain a second confidence level pertaining to putative existence of said at least first relationship between said at least first and second entities; and computer usable program code for combining said first and second confidence levels to obtain an overall inference whether said at least first relationship exists between said at least first and second entities wherein said computer usable program code for combining comprises computer usable program code for performing the summation:

$$\sum_{n=1}^{N} (V_n \cdot w_n)$$

where:
each of said first assessor and said second assessor represents said confidence levels as a value, $V_n$, between zero and one, with n indicating an nth one of said assessors;
$w_n$ is a weight for said nth one of said assessors; and
N=a total number of said assessors, wherein N>1;

$$\sum_{n=1}^{N} w_n = 1.$$

18. The computer program product of claim 17, further comprising computer usable program code for applying a plurality of additional assessors to obtain a plurality of additional confidence levels pertaining to putative existence of said at least first relationship between said at least first and second entities, wherein said computer usable program code for combining said first and second confidence levels further comprises computer usable program code for combining said plurality of additional confidence levels to obtain said overall inference.

19. The computer program product of claim 18, wherein each of said first assessor, said second assessor, and said plurality of additional assessors represents said confidence levels as the value, $V_n$, between zero and one.

20. The computer program product of claim 17; further comprising:

computer usable program code for applying a third assessor to obtain a third confidence level pertaining to putative existence of at least a second relationship between said at least first and second entities;

computer usable program code for applying a fourth assessor to obtain a fourth confidence level pertaining to putative existence of said at least second relationship between said at least first and second entities; and computer usable program code for combining said third and fourth confidence levels to obtain an overall inference whether said at least second relationship exists between said at least first and second entities.

21. The computer program product of claim 20, further comprising:

computer usable program code for storing at least (i) a list of candidate types of relationships including at least said first relationship and said second relationship, and (ii) a list of assessors for each of said candidate types of relationships, said list including at least said first and second assessors for said first relationship and said third and fourth assessors for said second relationship; and computer usable program code for facilitating editing of both said list of candidate types of relationships and said list of assessors for each of said candidate types of relationships by a user of said computer usable program code.

22. The computer program product of claim 17, further comprising:

computer usable program code for applying said first assessor to obtain a third confidence level pertaining to putative existence of said at least first relationship between at least third and fourth entities;

computer usable program code for applying said second assessor to obtain a fourth confidence level pertaining to putative existence of said at least first relationship between said at least third and fourth entities; and computer usable program code for combining said third and fourth confidence levels to obtain an overall inference whether said at least first relationship exists between said at least third and fourth entities.

23. The computer program product of claim 22, wherein said entities comprise at least software artifacts, stakeholders, and tasks.

24. The computer program product of claim 17, further comprising:

computer usable program code for repeating said applying of said first and second assessors and said combining for a plurality of additional entities and relationships; and computer usable program code for forming a graph-like representation depicting said relationships among said entities.

25. The computer program product of claim 24, further comprising computer usable program code for updating said graph-like representation to reflect changes in said relationships.

26. The computer program product of claim 25, wherein at least some of said changes in said relationships result from changes in at least some of said entities.

27. The computer program product of claim 17, wherein:
said entities comprise software artifacts;
said at least first relationship comprises a "tests" relationship;
said first assessor comprises one of a create-time assessor, a name matching assessor, a control flow assessor, a user interaction assessor, and a preceding version assessor; and said second assessor comprises another one of a create-time assessor, a name matching assessor, a control flow assessor, a user interaction assessor, and a preceding version assessor.

28. The computer program product of claim 17, wherein: said entities comprise software artifacts; and said at least first relationship comprises an "implements" relationship.

29. The computer program product of claim 17, further comprising:
    computer usable program code for repeating said applying of said first and second assessors and said combining in a pair-wise manner for a plurality of additional entities and relationships; and
    for each of said pairs of entities;
        computer usable program code for determining which of a plurality of candidate relationships can apply to a given one of said pairs of entities; and
        computer usable program code for determining which of a plurality of candidate assessors can apply to a given one of said plurality of candidate relationships for said given one of said pairs of entities.

30. An apparatus for inferring whether at least a first relationship exists between at least first and second entities, the apparatus comprising:
    a memory; and
    at least one processor, coupled to the memory, operative to:
        apply a first assessor to obtain a first confidence level pertaining to putative existence of said at least first relationship between said at least first and second entities;
        apply a second assessor to obtain a second confidence level pertaining to putative existence of said at least first relationship between said at least first and second entities; and
        combine said first and second confidence levels to obtain an overall inference whether said at least first relationship exists between said at least first and second entities, wherein the at least one processor is further operative to combine said first and second confidence levels by performing the summation:

$$\sum_{n=1}^{N} (V_n \cdot w_n)$$

where:
    each of said first assessor and said second assessor represents said confidence levels as a value, $V_n$, between zero and one, with n indicating an nth one of said assessors;
    $w_n$ is a weight for said nth one of said assessors; and
    N=a total number of said assessors, wherein N>1;

$$\sum_{n=1}^{N} w_n = 1.$$

31. A computer program product comprising a tangible computer useable readable recordable storage memory including computer usable program code for building a database associated with a relationship manager program, said database comprising at least a plurality of candidate relationships and a plurality of candidate assessors, said computer program product including:
    computer usable program code for facilitating registration of said plurality of candidate assessors with said manager program, based at least in part upon input from human experts having assessor-related knowledge, said registration of said plurality of candidate assessors including at least indications of which of said plurality of candidate assessors can assess which kinds of said candidate relationships; and
    computer usable program code for facilitating registration of said plurality of candidate relationships with said manager program, based at least in part upon input from human relationship experts having relationship-related knowledge, said registration of said plurality of candidate relationships including at least indications of which of said plurality of candidate relationships can apply to given pairs of said plurality of entities, wherein:
    when it is indicated that one of said plurality of candidate relationships can apply to a pair of software artifacts, the one of said plurality of candidate relationships is a tests relationship, wherein one artifact of the pair tests another artifact of the pair, or an implements relationship, wherein the one artifact of the pair implements the other artifact of the pair.

\* \* \* \* \*